US006198210B1

(12) United States Patent
Kroon et al.

(10) Patent No.: US 6,198,210 B1
(45) Date of Patent: *Mar. 6, 2001

(54) ELECTRON TUBE HAVING A SEMICONDUCTOR CATHODE WITH LOWER AND HIGHER BANDGAP LAYERS

(75) Inventors: Ron Kroon; Tom Van Zutphen; Erwin A. Hijzen, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/198,927

(22) Filed: Nov. 24, 1998

Related U.S. Application Data

(63) Continuation of application No. 09/022,450, filed on Feb. 12, 1998, now Pat. No. 5,880,481.

(30) Foreign Application Priority Data

Feb. 24, 1997 (EP) ........................................ 97200509

(51) Int. Cl.[7] .......................... H01J 29/00; H01J 31/00; H01J 31/26; H01L 29/06; H01L 29/12

(52) U.S. Cl. .................... 313/366; 313/373; 313/346 R; 257/10; 257/11; 257/77

(58) Field of Search ............................ 313/364, 366–68, 313/346 R, 446, 447, 448, 449, 346 DC, 373, 499, 500; 257/10–11, 77–78; 438/20

(56) References Cited

U.S. PATENT DOCUMENTS 4,616,248 * 10/1986 Khan et al. ........................... 257/11
5,880,481 * 3/1999 Kroon et al. .......................... 257/11

* cited by examiner

*Primary Examiner*—Nimeshkumar D. Patel
*Assistant Examiner*—Mack Haynes
(74) *Attorney, Agent, or Firm*—Robert J. Kraus

(57) ABSTRACT

A semiconductor cathode (11) in a semiconductor structure, in which the sturdiness of the cathode is increased by covering the emitting surface (4) with a layer of a semiconductor material (7) having a larger bandgap than the semiconductor material of the semiconductor cathode. Various measures for increasing the electron-mission efficiency are indicated.

8 Claims, 5 Drawing Sheets

ELECTRON TUBE HAVING A SEMICONDUCTOR CATHODE WITH LOWER AND HIGHER BANDGAP LAYERS

CROSS REFERENCE TP RELATED APPLCIATIONS

This is a continuation of application Ser. No. 09/022,450, filed Feb. 12, 1998 now U.S. Pat. No. 5,880,481.

The invention relates to a semiconductor device for generating electrons comprising a semiconductor body of a semiconductor material having at least one structure for emitting electrons, which structure is adjacent to a main surface of the semiconductor body and in which structure electrons can be generated by applying suitable electric voltages, which electrons emanate from the semiconductor body at the location of an emitting surface region.

The invention also relates to an electron tube provided with such a semiconductor device.

The electron tube can be used as a display tube or a camera tube, but it may also be constructed so as to be suitable for electrolithographic applications or electron microscopy.

A semiconductor device of the type mentioned hereinabove is shown in U.S. Pat. No. 4,303,930 (PHN 9532). In the semiconductor device, which is a so-called "cold cathode", a p-n junction is operated in the reverse direction in such a manner that avalanche multiplication of chare carriers takes place. As a result of this, electrons can receive sufficient energy to exceed the work function. The emanation of the electrons is further stimulated by the presence of accelerating electrodes or gate electrodes and by providing the semiconductor surface, at the location of the emitting surface region, with a work function-reducing material, such as cesium.

Particularly the use of cesium as the work function-reducing material often leads to problems. This can be attributed to the fact that, for example, cesium is sensitive to the presence (in the operating environment) of oxidizing gases (such as water vapor, oxygen, $CO_2$). In addition, as cesium has a high vapor pressure, it evaporates easily, which may be a drawback in applications where (semiconductor) substrates or preparations are situated in the vicinity of the cathode, as is the case in electron lithography or electron microscopy. In addition, ESD (Electron Stimulated Desorption) occurs; the electrons emitted by the cathode induce desorption of the cesium, in particular from slightly oxidied surfaces. A slight degree of oxidation occurs, for example, during spot-knocking of the electron tube.

One of the objects of the invention is to overcome one or more of the above-mentioned problems. To achieve this, a semiconductor device in accordance with the invention is characterized in that the structure for emitting electrons is covered with at least one layer of a further semiconductor material having a larger bandgap than the first semiconductor material.

The invention is based on the insight that notwithstanding the fact that the larger bandgap of the further semiconductor material constitutes an additional barrier to electrons, which are generated in the cold cathode, these electrons still reach, depending on the electric voltage applied between the further semiconductor material and the structure for emitting electrons, the surface of the layer of the further semiconductor material. Subsequently, the electrons are emitted from the further semiconductor material into the vacuum.

The invention further provides a number of measures for reducing the above-mentioned barrier. For example, a preferred embodiment of a semiconductor device in accordance with the invention is characterized in that the further semiconductor material is doped with dopants causing n-type conduction. As a result of this, said barrier is reduced so that a lower electric voltage between the further semiconductor material and the structure suffices to enable electrons to emanate. The reduction of the barrier is preferably such that an electric voltage is not necessary. The further semiconductor material preferably has a negative electron affinity (NEA). This is a condition in which the energy level of the vacuums at the surface is below the energy level of the minimum of the conduction band of the relevant semiconductor material. A similar situation is achieved by coating semiconductor material which does not intrinsically exhibit NEA properties with a layer of a work function-reducing material, such as cesium. Even if said coating with a layer of a work function-reducing material does not lead to NEA properties, the advantage that the above-mentioned ESD effect is precluded is nevertheless achieved (the layer of a further semiconductor material now serves, as it were, as a bonding layer for the work function-reducing material).

In another embodiment, the electric voltage is not applied between the further semiconductor material and the structure for emitting electrons, but between (an) electrode(s) provided near the main surface of the semiconductor body. The so-called Schottky effect also causes a reduction of the barrier. The electrode is situated, for example, on the surface of the semiconductor body (gate electrode). In another example, the electrode is a grid in the electron tube. A combination is possible too.

The electron-mission efficiency of the cold cathode thus formed is further increased by covering the further semiconductor material with a layer of a work function-reducing material, such as cesium. The above-mentioned ESD effect no longer occurs because the further semiconductor material is practically inert.

Suitable materials for the further semiconductor material have a bandgap of the order of 2 to 6.5 eV. The materials are preferably selected from the group formed by silicon carbide (BSiC, 4HSiC and various other poly-types), aluminium nitride (for example hexagonal AlN), cubic boron nitride (cBN), gallium-arsenic nitride ($Al_xGa_yN$) and carbon-based materials ((semiconducting) diamond, diamond-like carbon material, monocrystalline and polycrystafline diamond, amorphous carbon).

To avoid bonding problems as well as mechanical stresses, if necessary, an additional layer of a material whose lattice constant lies between that of the semiconductor material and that of the further semiconductor material is situated between the semiconductor body and the further layer of semiconductor material.

These and other aspects of the invention will be apparent from and elucidated with reference to the embodiments described hereinafter.

Figure 1:
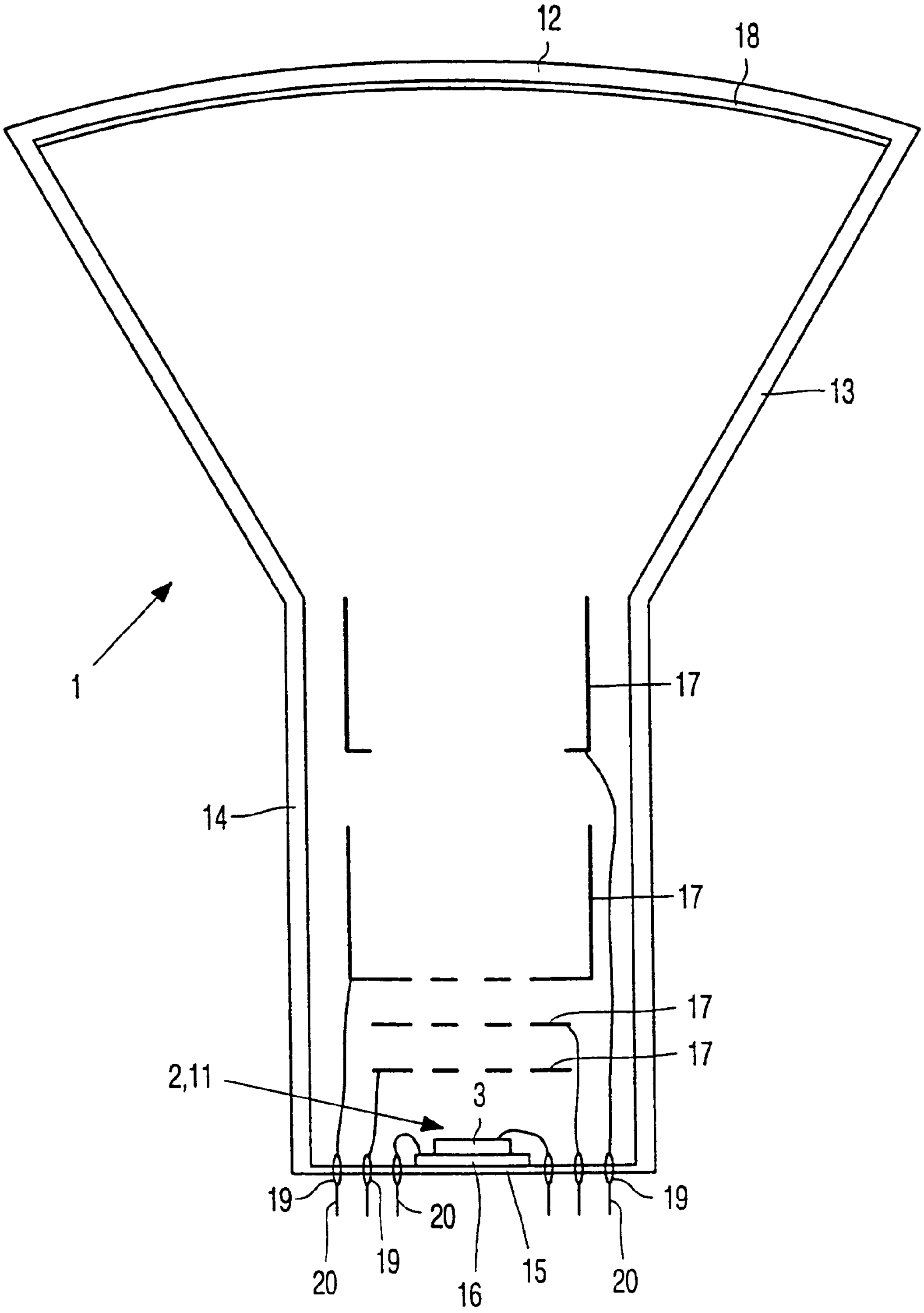
FIG. 1 shows an electron tube in accordance with the invention.

FIG. 1 schematically shows an electron tube 1, in this case a cathode ray tube for displaying images. This electron tube is composed of a display window 12, a cone 13 and an end portion 14 having an end wall 15. A support 16 is provided on the inner surface at the location of the end wall 15, a semiconductor device 2 having one or more semiconductor cathodes in a semiconductor body 3 being provided on said support 16. Grid electrodes 17 are situated in the neck portion 14. The cathode ray tube further comprises a * phosphor screen 18 at the location of the display window and, if necessary, deflection electrodes. For clarity, further elements which belong to such a cathode ray tube, such as deflection coils, shadow masks, etc., are not shown in FIG. 1. To provide an electric connection for, inter alia, the cathode and the accelerating electrodes, the end wall 15 is provided with feed-throughs 19 via which the connection wires for these elements are electrically connected to connection pins 20.

Figure 2:
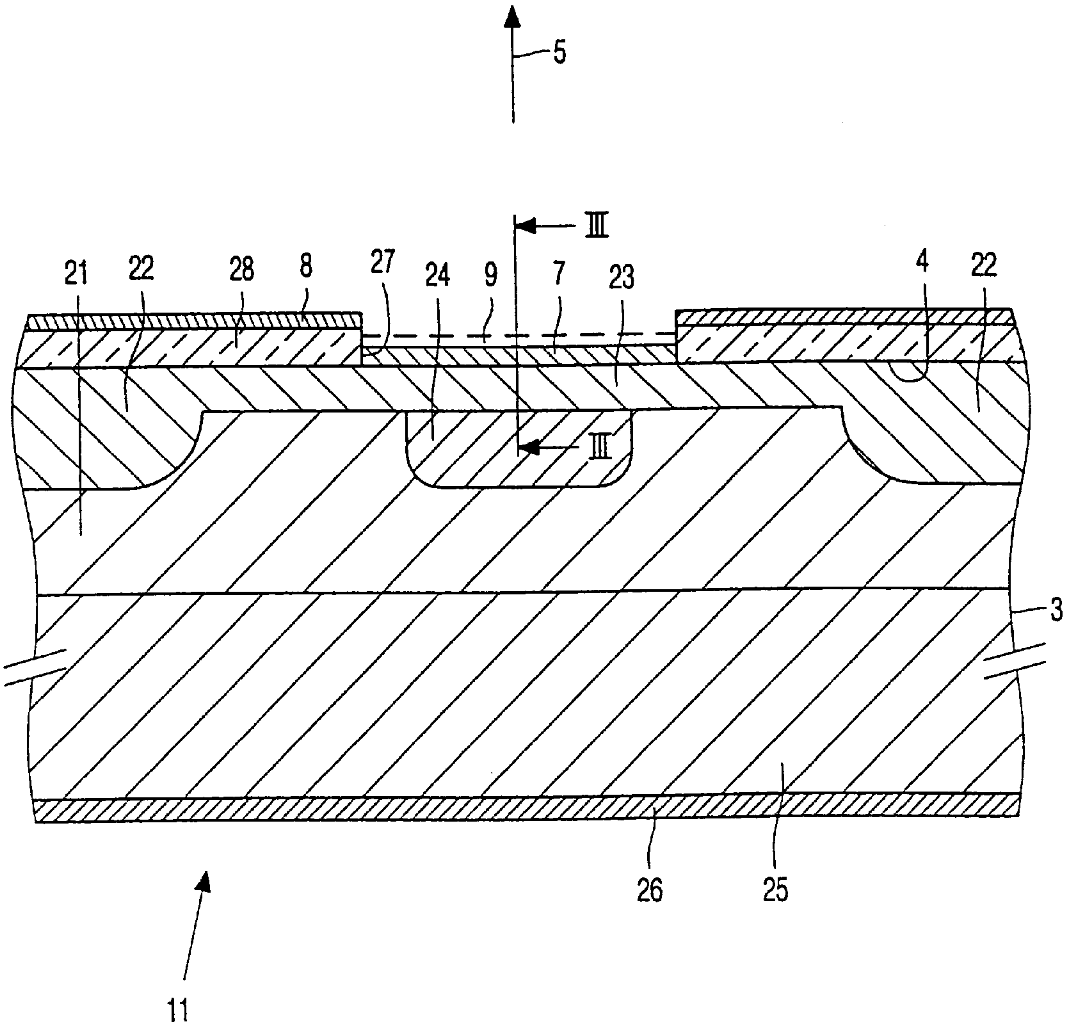
FIG. 2 is a sectional view of a cathode used in said electron tube.

FIG. 2 is a cross-sectional view of a part of a possible embodiment of a cathode 11 which is composed of a semiconductor body 3 with a p-type substrate 21. In this example, silicon is used as the material for the semiconductor body 3. A main surface 4 is provided with an n-type region 22, 23 which consists of a deep diffusion zone or an implanted region 22 and a thin n-type layer 23 at the location of the actual emission region. To reduce the voltage at which avalanche breakdown occurs in this region, the acceptor concentration in the substrate is locally increased by means of a p-type region 24 which is provided by means of ion implantation. The n-type layer 23 has such a thickness that in the case of breakdown of the p-n junction between the regions 23 and 24, the depletion layer does not extend up to the main surface 4 but instead is sufficiently thin to allow passage of electrons generated by avalanche breakdown. In this example, the substrate 21 is contacted via a highly-doped p-type zone 25 and a metallization 26, while the n-type region 22 is connected via a contact metallization (not shown).

The main surface 4 is covered with a layer 28 of an insulating material.

In this example, the actual emitting region is situated at the location of an aperture 27 in a layer 28 of the insulating material, in this example silicon oxide. In addition, in this example a gate electrode 8 is situated around the aperture 27. If the p-n junction between the regions 23, 24 is connected in the reverse direction, electrons having sufficient energy to reach the main surface 4 of the semiconductor body can be generated by means of avalanche multiplication. In FIG. 2, the beam of electrons is indicated by an arrow bearing reference numeral 5. For a description of the operation of such a cathode and for other possible embodiments of the cathode reference is made to U.S. Pat. No. 4,303,930 (PHN 9532). Other possible structures are described in U.S. Pat. No. 4,506,284 (PHB 32,829), U.S. Pat. No. 4,516,146 (PHB 32,860), U.S. Pat. No. 4,801,994 (PHN 11.670) and U.S. Pat. No. 5,243,197 (PHN 12.988).

In accordance with the invention, within the aperture 27 in layer 28, a layer of a further semiconductor material 7 having a larger bandgap than the silicon is situated on the structure suitable for emitting electrons. The bandgap for silicon is approximately 1.1 eV. For the semiconductor material 7 use is made, for example, of hydrogen-etermined diamond having a bandgap of approximately 5.5 eV. This material exhibits NEA properties, that is, the energy level ($E_{vac}$ in FIGS. 3*b*, 3*c*, 3*d*) of the vacuum is below the energy level of the conduction band in this material. The working principle is schematically shown in FIGS. 3*a*, 3*b*–3*d*. Electrons 5 are generated and/or accelerated in the region of the reverse-biased junction 29. Depending on the energy received, a number of electrons can pass through the barrier of the layer 7 and reach the surface 30 of said layer 7. To maximize the efficiency, the layer 7 should be as thin as possible, for example thinner than 100 nanometers, and it is for example, by providing it by means of PCVD or MBE.

Figure 3A:
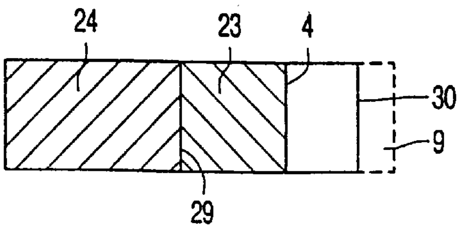
FIGS. 3 through 5 show a number of schematic sectional views of cathodes and the associated band schemes.
Figure 3B:
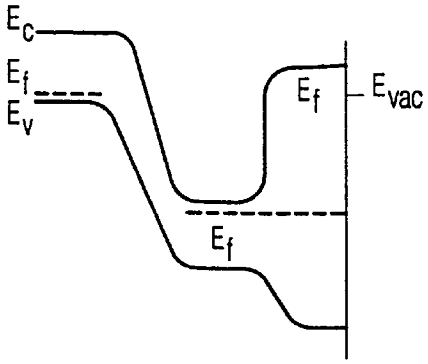
Figure 3C:
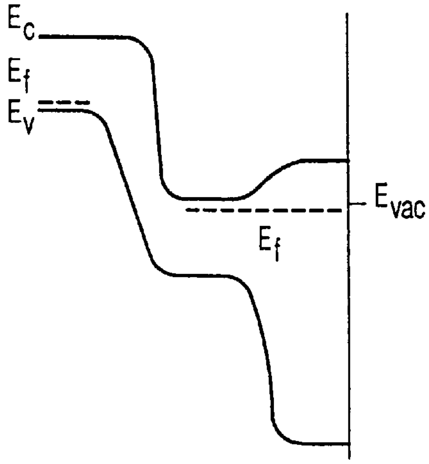
Figure 3D:
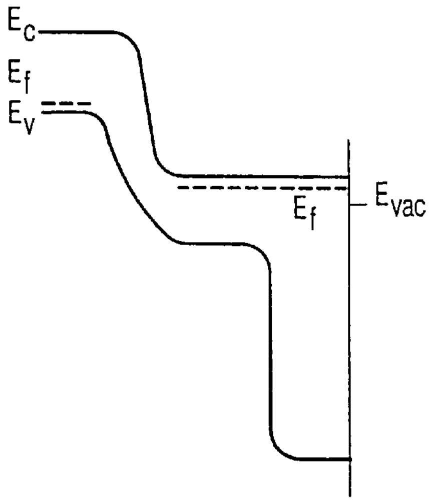

By giving the layer 7 an n-type doping, said barrier can be reduced (FIG. 3*c*) or even become zero (FIG. 3*d*). In this example, the n-type region is doped with nitrogen, phosphor or arsenic ($>10^{17}/cm^3$, preferably $>10^{18}/cm^3$). Other materials which can suitably be used for the layer 7 are various types of silicon carbide (SiC, bandgap 2.1–3.3 eV), aluminium nitride (A/N, bandgap approximately 6.2 eV), carbon-based material, cubic boron nitride (cBN, bandgap approximately 6.4 eV) and gallium-arsenic nitride ($Al_xGa_yN$, bandgap 3.5–6.2 eV). Emanation of the electrons is further facilitated by using a layer 9 of a work function-reducing material (indicated by broken lines in FIG. 2).

In another embodiment (not shown), the layer 7 is provided with a very high p-type doping and a contact terminal. If the pn-junction between the n-type layer 23 and the p-type doped layer 7 is forward-biased, then the reduction of the energy barrier for electrons generated in the pn-junction 29 is sufficient to cause emission.

Figure 4A:
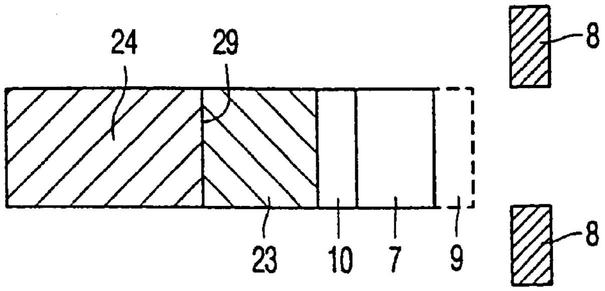
Figure 4B:
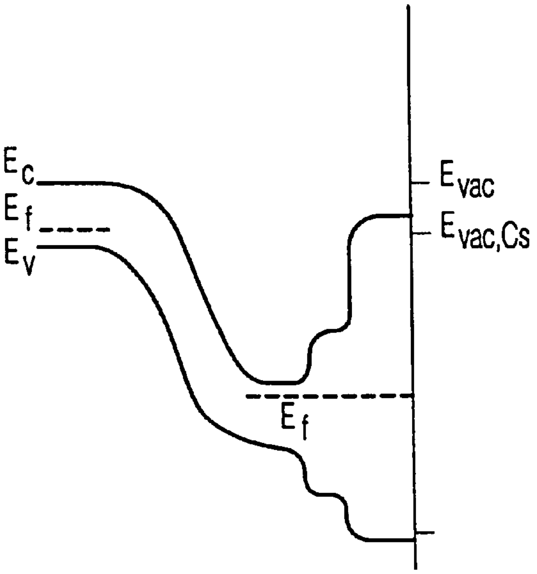

FIG. 4 shows a variant in which the pn-junction 29 is also reverse-biased and the material of the layer 7 does not exhibit NEA properties (the energy level ($E_{vac}$ in FIGS. 4*b,c*) of the vacuum is higher than the energy level of the conduction band in this material). In this case, the vacuum potential is reduced by applying a layer of cesium (the vacuum potential is reduced from $E_{vac}$ to $E_{vac}$, $c_s$).

Figure 4C:
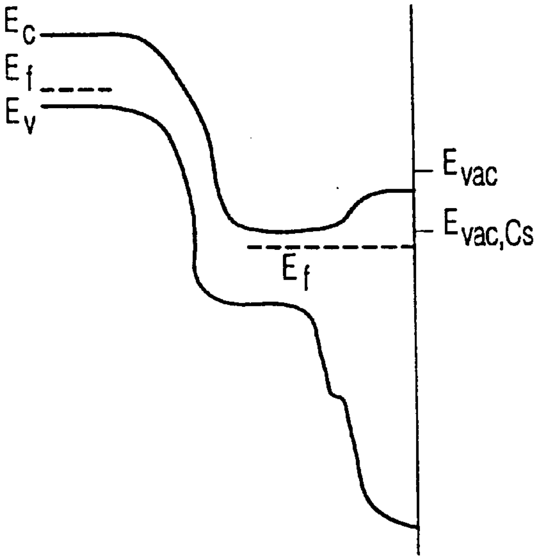

Also a strong electric field at the surface 30, which is generated via a (schematically shown) electrode 8, causes a reduction of the work function (Schottky effect). Also in the example shown in FIG. 4, said barrier can be reduced by giving the layer 7 an n-type doping (FIG. 4*c*). The electrode 8 is formed, for example, on the semiconductor body (gate electrode), but, in another example, this electrode is a grid in the electron tube.

In the example shown in FIG. 4, an additional layer 10 is provided between the n-type layer 23 and the layer 7 having a larger bandgap. For the layer 10 use is made of a material having a lattice constant which ranges between the lattice constants of (in this example) silicon and diamond, for example BSiC. On the one hand, the layer 10 is sufficiently thick to reduce mechanical stresses between the layers 23 and 7, and, on the other hand, it is so thin, preferably thinner than 10 nanometers, that the band schemes shown and hence the operation of the cathodes shown is hardly influenced, or perhaps not at all.

As stated hereinabove, if necessary, a layer of a work function-reducing material 9 is provided on the layer of a highly-doped semiconductor material 7. It has been found that, particularly for cesium, diamond and other carbon-based materials and SiC form good bonding layers, which also leads to fewer problems with respect to the above-mentioned ESD effect.

Figure 5:
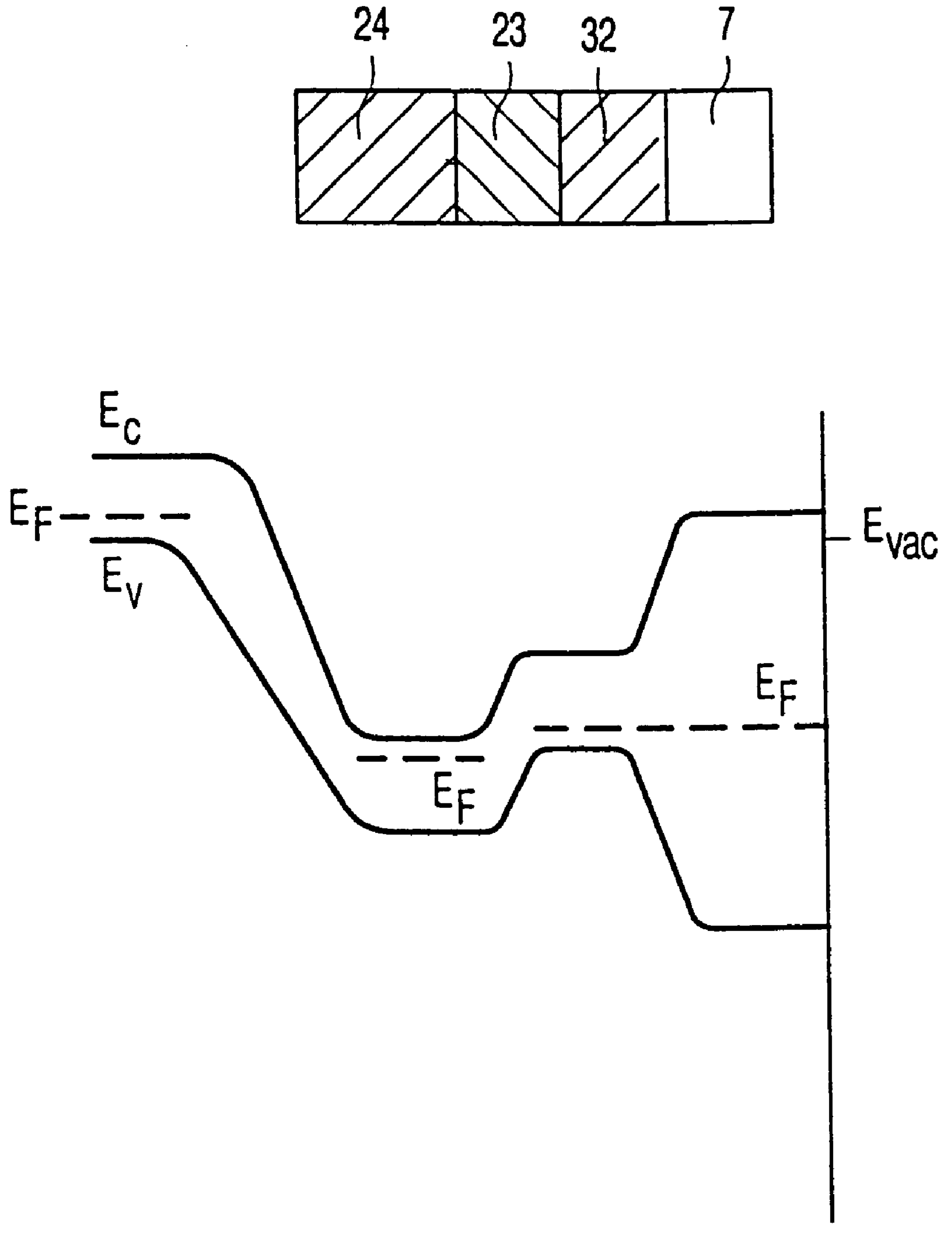

FIG. 5 shows a variant of FIG. 3*a*, in which a very thin n-type layer 23 is arranged between the p-type region 24 and a p-type layer 32 which is also very thin (the layers 23, 32 are preferably thinner than 4 nm), as described in U.S. Pat. No. 5,243,197 (PHN 12.988). Also in this case, a layer 7 of a semiconductor material having a larger bandgap than the material of the actual cathode (silicon or silicon carbide) is provided.

Of course, the invention is not limited to the examples shown herein; for example, in other embodiments of the material in which the emitting structure is formed, use is made of another semiconductor material, for example silicon carbide or gallium arsenic. The layer 7 referred to in this Application always consists of one material with a larger bandgap, however, said layer may alternatively be composed of various materials with a larger bandgap.

The cathode is insensitive to oxidation and hence can very suitably be used in an environment where (whether or not temporarily) an oxidizing effect occurs, for example in an electron microscope or in equipment for electron lithography.

In summary, the invention relates to an electron tube comprising a semiconductor cathode in a semiconductor structure, in which the sturdiness of the cathode is increased by covering the emitting surface with a layer of a semiconductor material having a larger bandgap than the cathode material, and various measures for increasing the efficiency of the electron emission also being indicated.

What is claimed is:

1. A semiconductor device for generating electrons comprising a semiconductor body of a first semiconductor material having at least one structure for emitting electrons, which structure is adjacent to a main surface of the semiconductor body and in which electrons can be generated by applying suitable electric voltages, which electrons emanate from the semiconductor body at the location of an emitting surface region, characterized in that the structure for emitting electrons is covered with at least one layer of second semiconductor material having a larger bandgap than the first semiconductor material.

2. The semiconductor device as claimed in claim 1, characterized in that the second semiconductor material has a negative electron affinity.

3. The semiconductor device as claimed in claim 1, characterized in that the semiconductor device is provided at the main surface with at least one gate electrode.

4. The semiconductor device as claimed in claim 1, characterized in that the second semiconductor body is doped with impurities causing n-type conduction.

5. The semiconductor device as claimed in claim 1, characterized in that the surface of the second semiconductor material is covered with a layer of a work-function-reducing material.

6. The semiconductor device as claimed in claim 1, characterized in that the second semiconductor material comprises a material selected from the group consisting of silicon carbide, aluminium nitride, diamond, cubic boron nitride, gallium-arsenic nitride and carbon-based materials.

7. The semiconductor device as claimed in claim 1, characterized in that an additional layer of a material whose lattice constant lies between that of the first semiconductor material and that of the second semiconductor material is situated between the semiconductor body and said second layer of semiconductor material.

8. An electron tube comprising a semiconductor device as claimed in claim 1.

* * * * *